United States Patent
Driemel et al.

(10) Patent No.: US 8,766,637 B2
(45) Date of Patent: Jul. 1, 2014

(54) DRUM-TYPE STANDING WAVE TRAP

(75) Inventors: Daniel Driemel, Oederan (DE); Helmut Greim, Adelsdorf (DE); Martin Hemmerlein, Bamberg (DE); Thomas Kundner, Buckenhof (DE); Steffen Wolf, Röttenbach (DE)

(73) Assignee: Siemens Aktiengesellschaft, München (DE)

( * ) Notice: Subject to any disclaimer, the term of this patent is extended or adjusted under 35 U.S.C. 154(b) by 251 days.

(21) Appl. No.: 13/183,771

(22) Filed: Jul. 15, 2011

(65) Prior Publication Data
US 2012/0182015 A1     Jul. 19, 2012

(30) Foreign Application Priority Data
Jul. 16, 2010   (DE) .......................... 10 2010 027 295

(51) Int. Cl.
*G01V 3/00*     (2006.01)

(52) U.S. Cl.
USPC .......................................... 324/322; 324/318

(58) Field of Classification Search
USPC ................................. 324/322, 318, 314, 300
See application file for complete search history.

(56) References Cited

U.S. PATENT DOCUMENTS

| | | | | |
|---|---|---|---|---|
| 4,682,125 A | * | 7/1987 | Harrison et al. | 333/12 |
| 6,593,744 B2 | * | 7/2003 | Burl et al. | 324/322 |
| 7,902,953 B1 | * | 3/2011 | Watt | 336/200 |
| 8,207,737 B2 | * | 6/2012 | Greim | 324/322 |
| 8,400,153 B2 | * | 3/2013 | Evers et al. | 324/322 |
| 2003/0173099 A1 | | 9/2003 | Reykowski | |
| 2006/0131965 A1 | | 6/2006 | Friedland | |
| 2008/0136415 A1 | | 6/2008 | de Rooij et al. | |
| 2010/0148775 A1 | | 6/2010 | Greim | |

FOREIGN PATENT DOCUMENTS

CN    1445880 A      10/2003
DE    103 14 215 B4  11/2006

OTHER PUBLICATIONS

German Office Action dated Jun. 7, 2011 for corresponding German Patent Application No. DE 10 2010 027 295.7 with English translation.
Chinese Office Action dated Sep. 4, 2013 for corrsepsonding Chinese Patent Application No. 2011101996177 with English translation.

* cited by examiner

*Primary Examiner* — Louis Arana
(74) *Attorney, Agent, or Firm* — Lempia Summerfield Katz LLC

(57) ABSTRACT

A standing wave trap for a magnetic resonance tomography system includes a local coil connecting lead and at least one flexible printed circuit board in the local coil connecting lead. The local coil connecting lead is wound.

24 Claims, 4 Drawing Sheets

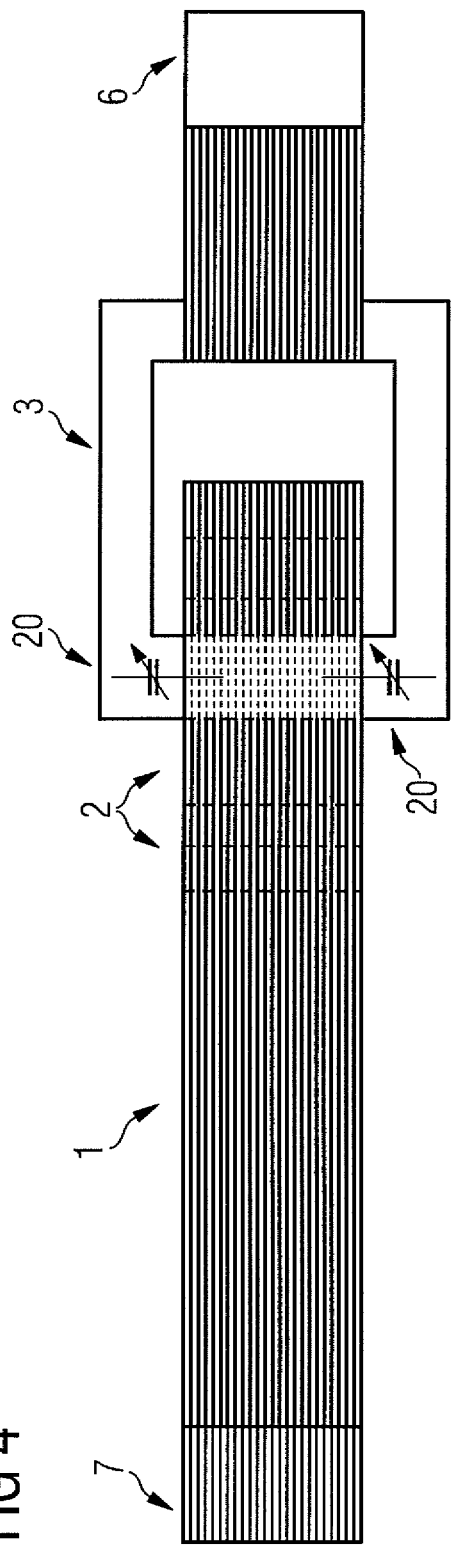
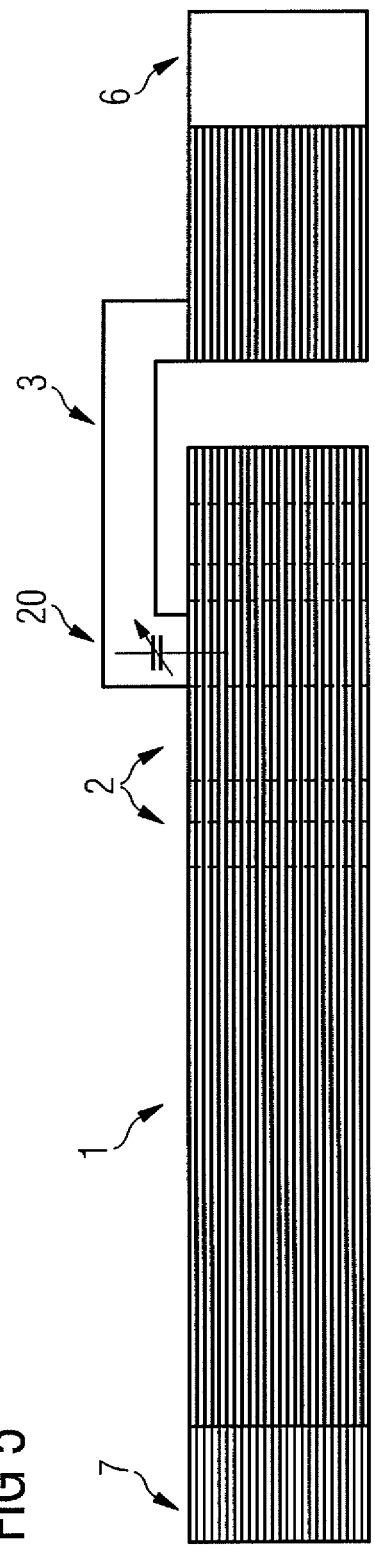

DRUM-TYPE STANDING WAVE TRAP

This application claims the benefit of DE 10 2010 027 295.7, filed Jul. 16, 2010.

BACKGROUND

The present embodiments relate to a standing wave trap for a magnetic resonance tomography (MRT) system.

Magnetic resonance tomography devices for examining objects or patients using magnetic resonance tomography (MRT, MRI) are known, for example, from DE 10314215B4.

In magnetic resonance tomography, RF coils (local coils) are used to receive alternating magnetic fields. In order to obtain a good signal-to-noise ratio at all times, the geometry and reception profile, for example, of the RF coil are adjusted to optimize the RF coils for different regions of a patient's body. To achieve the highest possible signal-to-noise ratio, local coils are generally positioned as close as possible to a patient's body.

Local coils are implemented, for example, as receive-only coils, and the spins are excited using a body coil (whole-body resonator) of an MRT system. Signals are transmitted from the local coils to the receiving system of an MRT facility via a local coil feeder cable, such as an RF cable. In the transmit phase, RF currents are induced on the cable shield of the local coil feeder cable by the E and B fields in an MRT system. Induced RF currents on, for example, local coil feeder cables are referred to as standing waves. Standing waves are undesirable and may lead to image interference. Worse yet, standing waves may even present a hazard to the patient.

Standing wave traps (SWTs) are inserted into the local coil feeder cable of the local coils in order to suppress radio-frequency currents (standing waves) on the outer conductor of local coil feeder cables. A standing wave trap is a highly resistive impedance for the RF wave and, consequently, suppresses the RF current on the local coil feeder cable.

SUMMARY

The present embodiments may obviate one or more of the drawbacks or limitations in the related art. For example, an optimized standing wave trap for a magnetic resonance tomography system may be provided.

The present embodiments describe a standing wave trap that is compact, lightweight, surge-proof, tunable, and/or equipped with a high blocking effect.

BRIEF DESCRIPTION OF THE DRAWINGS

FIG. 4 shows one embodiment of a standing wave trap in simplified form;

FIG. 5 shows another embodiment of a standing wave trap in simplified form;

DETAILED DESCRIPTION OF THE DRAWINGS

Figure 8:
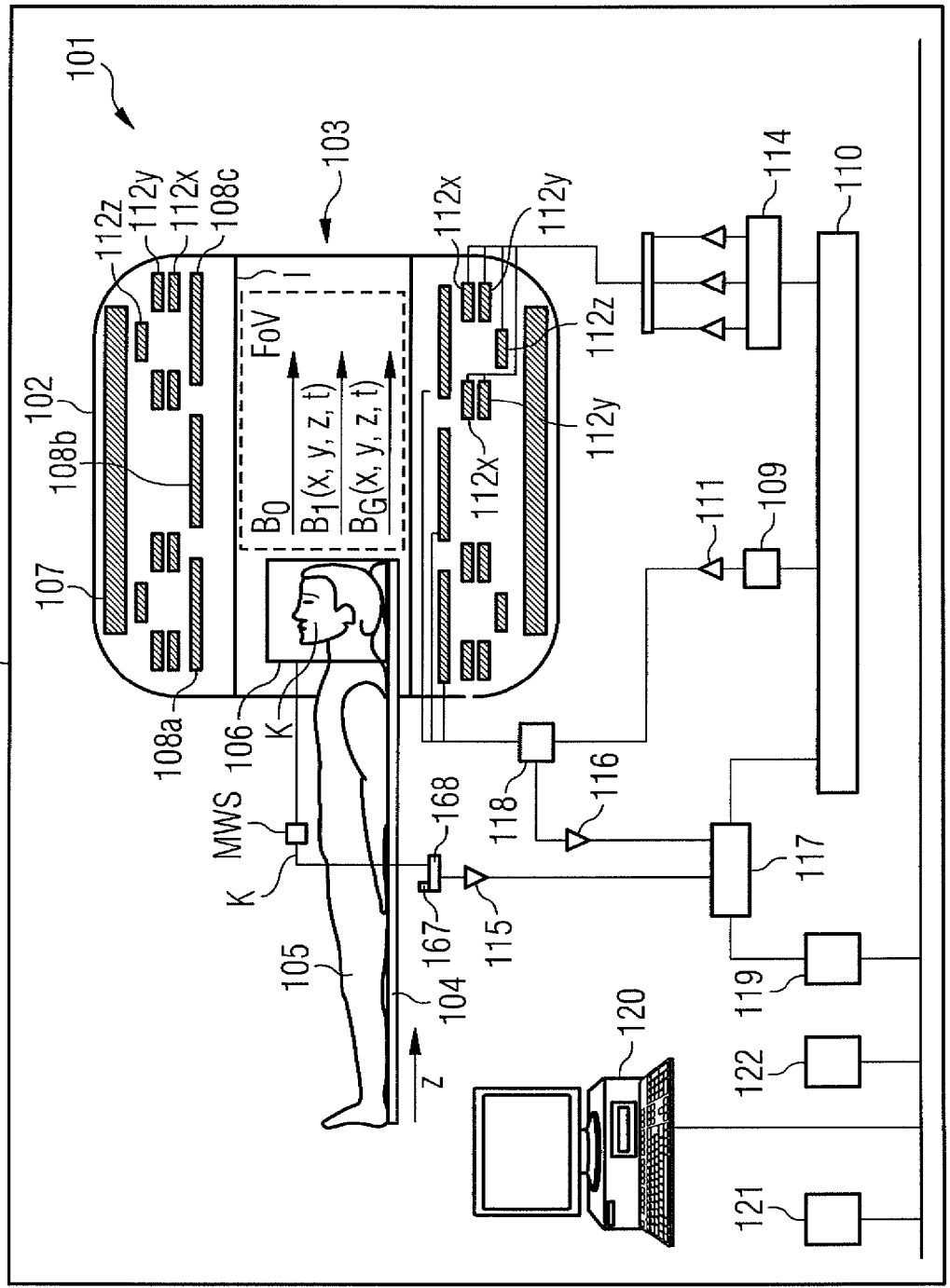
FIG. 8 shows a simplified schematic diagram of an MRT system.

FIG. 8 shows a magnetic resonance imaging (MRT) device 101 contained in a shielded room or a Faraday cage F. The device 101 has a whole-body coil 102 with a measurement chamber 103. In this embodiment, the measurement chamber 103 has a tubular space. A patient couch 104 that supports a body such as, for example, an examination subject (e.g., a patient) 105 (with or without a local coil arrangement 106) may be moved into the tubular space 103 in the direction of the arrow z in order to generate images of the patient 105 using an imaging method. In one embodiment, a local coil arrangement 106 is placed on the patient to generate images in a local region (also called the field of view). Signals of the local coil arrangement 106 may be evaluated (e.g., converted into images, stored or displayed) by an evaluation device 115, 117, 119, 120, and/or 121 of the MRT device 101. The evaluation device may be connected to the local coil arrangement via or using a local coil connecting lead such as, for example, a coaxial cable KX or, alternatively, via or using a wireless connection 167, 168.

In order to utilize magnetic resonance imaging to examine a body 105 (an examination subject or a patient) using a MRT device 101, different magnetic fields that are precisely coordinated (both temporally and spatially) are radiated onto the body 105. A strong magnet, such as a cryomagnet 107, generates a strong static main magnetic field $B_0$ ranging, for example, from 0.2 Tesla to 3 Tesla or more in a measurement chamber 103. In this embodiment, the measurement chamber 103 has a tunnel-shaped bore. The patient couch 104 supports a body 105 that is to be examined and is moved into a region of the main magnetic field $B_0$ that is approximately homogeneous in the area of observation FOV ("Field of View"). A radio-frequency antenna (and/or a local coil arrangement, if necessary), which is depicted herein, in simplified form, as body coil 108 (multipart=108a, 108b, 108c), emits magnetic radio-frequency excitation pulses B1 (x, y, z, t) to excite the nuclear spins of atomic nuclei of the body 105. Radio-frequency excitation pulses are generated, for example, by a pulse generation unit 109 that is controlled by a pulse sequence control unit 110. Following amplification of the radio-frequency excitation pulses by a radio-frequency amplifier 111, the pulses are routed to the radio-frequency antenna 108. FIG. 8 only depicts one embodiment of a radio-frequency system of the device 101. In other embodiments, more than one pulse generation unit 109, more than one radio-frequency amplifier 111 and a plurality of radio-frequency antennas 108a, b, c may be used in a magnetic resonance device 101.

The magnetic resonance device 101 also has gradient coils 112x, 112y, 112z that radiate magnetic gradient fields during a measurement to provoke selective layer excitation and to spatially encode the measurement signal. The gradient coils 112x, 112y, 112z are controlled by a gradient coil control unit 114, which, like the pulse generation unit 109, is connected to the pulse sequence control unit 110.

Signals transmitted by the excited nuclear spins (the atomic nuclei in the examination subject) are received by the body coil 108 and/or at least one local coil arrangement 106, amplified using associated radio-frequency preamplifiers 116, and processed further and digitized by a receiving unit 117. The recorded measured data is digitized and stored as complex numeric values in a k-space matrix. An associated MR image may be reconstructed using a multidimensional Fourier transform from the value-filled k-space matrix.

In one embodiment, a coil, such as a body coil 108 or a local coil, may be operated in both the send and the receive mode.

In this embodiment, correct signal forwarding is controlled by an upstream-connected duplexer 118.

From the measurement data, an image processing unit 119 generates an image that is displayed to a user via an operator console 120 and/or stored in a memory unit 121. A central computer unit 122 controls the individual system components.

In known MR tomography devices, images having a high signal-to-noise ratio (SNR) are usually acquired by or using local coil arrangements (e.g., loops and local coils). The local coil arrangements are antenna systems that are mounted in immediate proximity to, on (anterior), under (posterior), or in the body. During an MR measurement, the excited nuclei induce a voltage in the individual antennas of the local coil. The induced voltage is then amplified by or using a low-noise preamplifier (e.g., LNA or a preamp) and forwarded on to the receiving electronics. High-field systems, which have a magnetic field strength of at least 1.5 T, are employed for high-resolution images to improve the signal-to-noise ratio. If a number of individual antennas in excess of the number of receivers present may be connected to an MR receiving system, a switching array such as, for example, an RCCS, is installed between receive antennas and receivers. The switching array routes the currently active receive channels, which in most cases are those currently lying in the magnet's field of view, to the receivers. As a result, more coil elements, in excess of a number of available receivers, may be connected, since when the whole-body is covered, it is only necessary to read out those coils that are located in the field of view FOV or, in some embodiments, in the homogeneity volume of the magnet.

The local coil arrangement 106 generally serves as a way to refer, for example, to an antenna system that may, for example, consist of one antenna element or of a plurality of antenna elements (e.g., coil elements) embodied as an array coil. The individual antenna elements are implemented as, for example, loop antennas (loops) or butterfly or saddle coils.

A local coil arrangement includes, for example, coil elements, a preamplifier, further electronics (e.g., standing wave traps), a housing, supports, and, in most embodiments, a cable with a plug to connect the arrangement to the MRT system. A receiver 168 mounted on the system side filters and digitizes a signal received, for example, wirelessly by a local coil 106. The receiver 168 forwards or transmits the data to a digital signal processing device, which, in most embodiments, derives an image or a spectrum from the data acquired by or using a measurement and makes the image or spectrum available to the user. The user may, for example, use the image or the spectrum for a subsequent diagnosis and/or or store the image or the spectrum in a memory.

With reference to FIGS. 1-7, further details regarding exemplary embodiments of a standing wave trap are now described.

Figure 1:
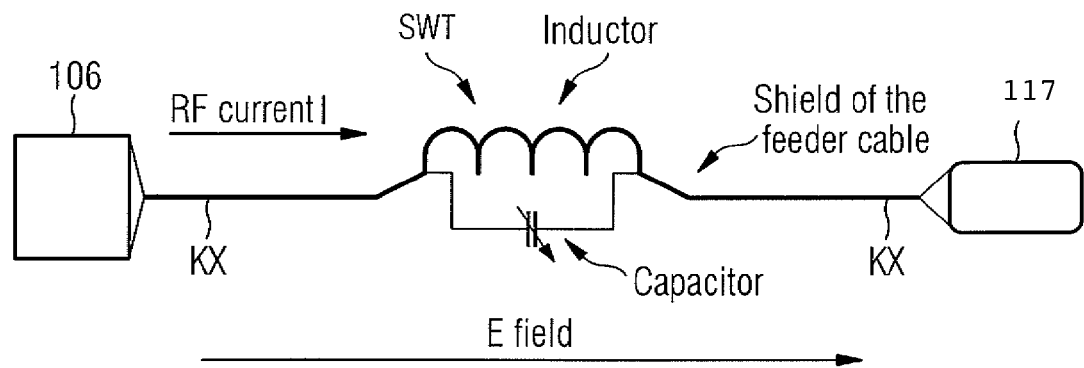
FIG. 1 shows one embodiment of an MRT standing wave trap.

FIG. 1 shows a simplified layout of a standing wave trap SWT in a shielded local coil connecting lead KX. The local coil connecting lead KX is connected at one end to an MRT local coil 106 and at the other end to an evaluation device 117 of an MRT system 101.

Figure 2:
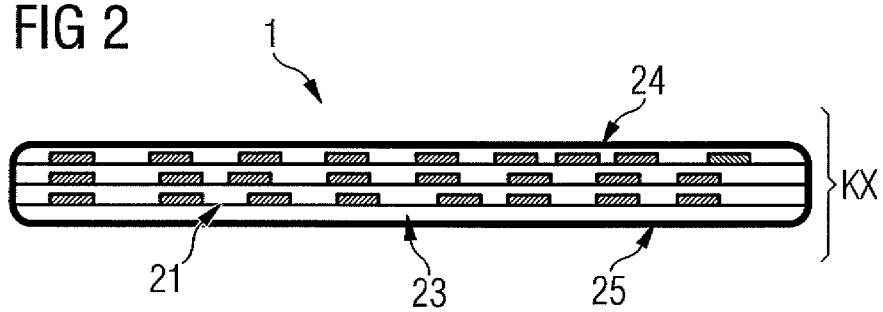
FIG. 2 shows the internal layout of flexible printed circuit boards forming a local coil feeder cable.
Figure 3:
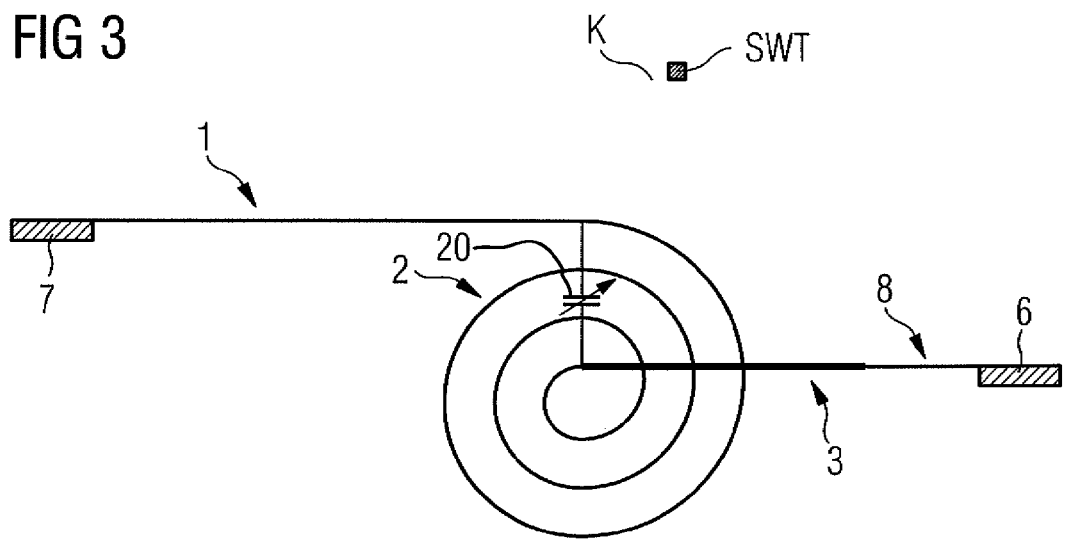
FIG. 3 shows a cross-section of one embodiment of a standing wave trap.

FIGS. 2-6 show schematic views of different embodiments of an MRT standing wave trap. FIG. 3 is a cross-sectional diagram of one embodiment of a standing wave trap, FIG. 4 depicts another embodiment of a standing wave trap, and FIG. 5 depicts yet another embodiment of a standing wave trap.

FIG. 2 shows a cross-section of a local coil connecting lead KX in which multiple flexible printed circuit boards 1 are stacked on top of one another. In other embodiments, multiple layers of one multilayer printed circuit board may be arranged in this way. Each circuit board 1 has a plastic substrate 23 in or on which a plurality of conductors (e.g., copper conductors) 21 run or are located. Each conductor 21 may be connected to the local coil and to an evaluation device of the MRT via plug connectors. The local coil connecting lead KX is either completely or partially (e.g., only on a part of the circumference and/or only on several sides) enclosed by an outer shield 24 (e.g., made of copper) to shield the local coil against electromagnetic waves. The shield is, in turn, enclosed by an outer insulator 25. A lateral shield may be implemented using, for example, plated-through holes.

In the embodiment shown in FIG. 2, the flexible printed circuit boards are completely and circumferentially enclosed by a conductive layer 24. As a result, the local coil connecting lead KX, which in this embodiment is a ribbon cable having multiple flexible printed circuit boards, is shielded. The common shield 24 may be used to implementing a standing wave trap SWT (according to FIG. 3).

The flexible printed circuit boards 1 of the local coil connecting lead KX are pliable or bendable and may be wound, for example, to or in a spiral shape as shown in FIG. 3 (which shows a cross-section of an SWT). Also shown in FIG. 3 are connector elements 6, 7. The connector elements 6, 7 may be male and/or female connectors. The local coil connecting lead KX may be connected to a local coil at one end using the connector element 6 and to an MRT evaluation device (via, for example, amplifiers) of an MRT system 101 at the other end using the connector element 7. In addition, FIG. 3 shows a capacitor 20 that is connected to the shield 24 at two points in order to form a standing wave trap on (the shield of) the local coil connecting lead KX.

Figure 6:
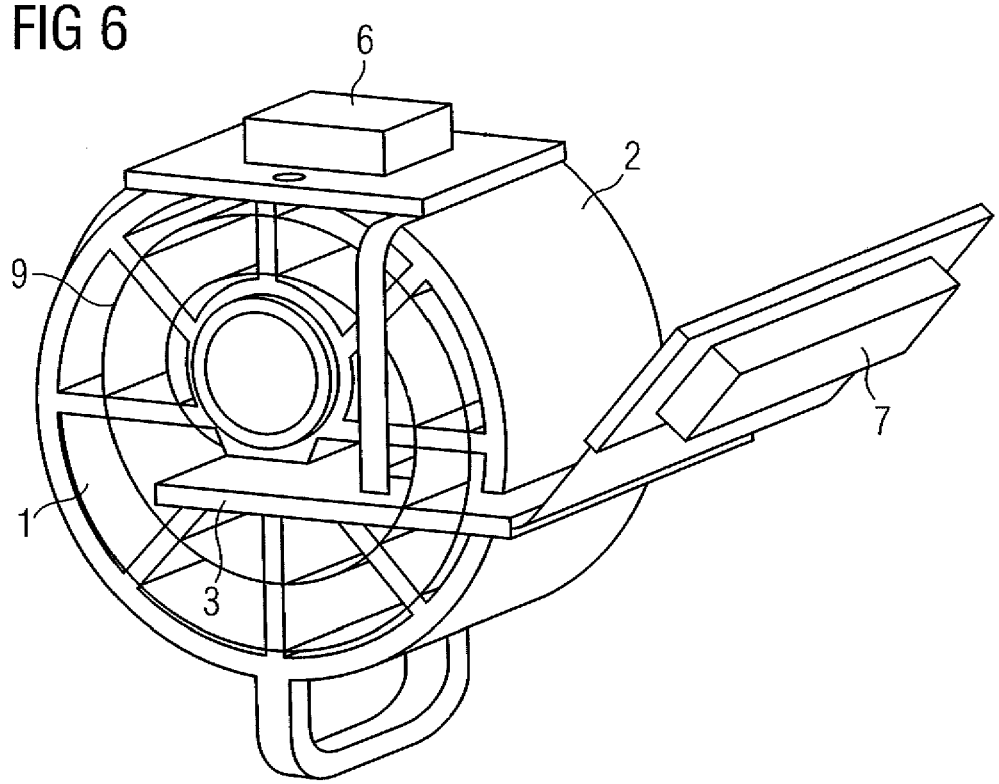
FIG. 6 shows a cross-section of one embodiment of a standing wave trap.

FIG. 6 shows the at least one flexible printed circuit board 1 (or the at least one layer of the flexible printed circuit board 1) of the local coil connecting lead KX wound in a spiral shape onto a plastic substrate 2 to produce another embodiment of a standing wave trap. Since one end of the local coil connecting lead KX ends inside the spiral in this embodiment, the one end of the local coil extends laterally outward on both sides of the spiral. In other embodiments, the one end of the local coil extends laterally outward on one side of the spiral. A capacitor 20 is seated on the central part of the lead KX, which in this embodiment is a rigid part or section 3, to produce an electrical resonance. The capacitor 20 may be routed back to the start of the spiral (which forms the local coil connecting lead KX in FIG. 6) via or using, for example, a copper strip or a lateral branch 21 of the flexible ribbon cable. For the standing wave trap SWT, the spiral represents an inductor with a parallel capacitor 20. The inductor is brought to parallel resonance with the matching value of the capacitor (which is, for example, adjustable) at the operating frequency (e.g. 120 MHz) of the standing wave trap or, in other words, at the frequency that is to be blocked by the standing wave trap.

A flexible section then continues again from the central rigid part 3 and ends at a plug-in module or a male/female connector 7.

The central rigid part 3 may extend laterally outward from the spiral on both sides or, as shown in FIG. 5, may extend laterally outward from just one side of the spiral.

Figure 7:
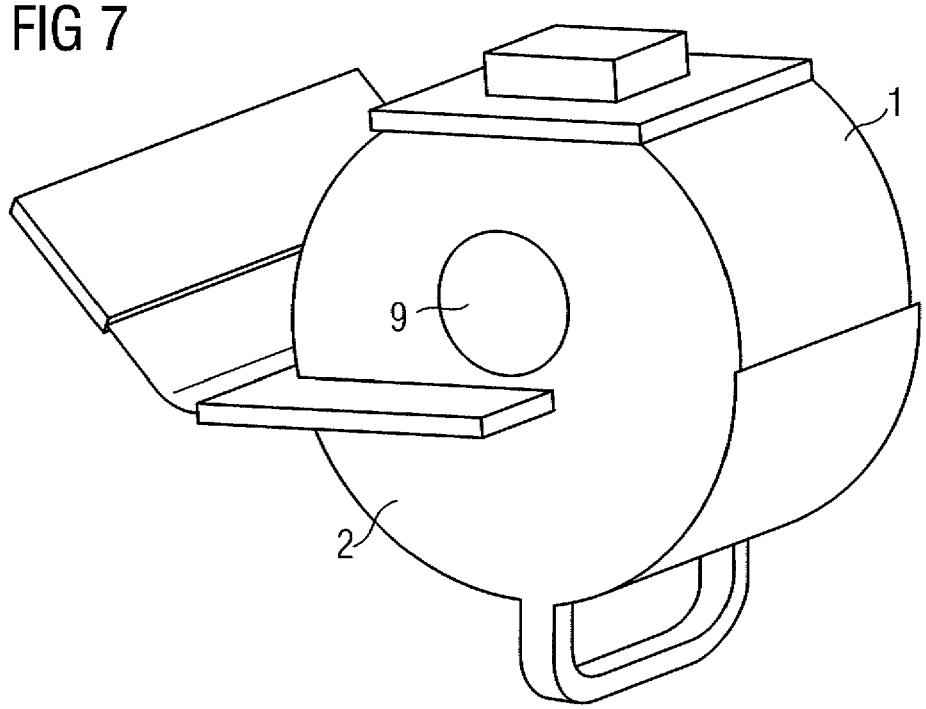
FIG. 7 shows a side-view of one embodiment of a standing wave trap.

In a certain section, the SWT may be tuned to a blocking frequency using a metallized plastic cylinder 9 (see FIG. 6) in the center of the spiral, as shown, for example, by the perspective view of FIG. 7. The plastic cylinder 9 is provided with an external thread and may, therefore, be screwed into the spiral.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A standing wave trap for a magnetic resonance tomography system, the standing wave trap comprising:
    a local coil connecting lead, wherein the local coil connecting lead is wound; and
    at least one flexible printed circuit board in the wound local coil connecting lead, wherein the at least one flexible printed circuit board is configured in a spiral shape.

2. The standing wave trap as claimed in claim 1, wherein the at least one flexible printed circuit board includes a plurality of conductors.

3. The standing wave trap as claimed in claim 1, wherein the local coil connecting lead is wound into a spiral shape.

4. The standing wave trap as claimed in claim 1, wherein the local coil connecting lead is wound into a spiral shape onto an electrical insulator.

5. The standing wave trap as claimed in claim 4, wherein the electrical insulator is a plastic substrate.

6. The standing wave trap as claimed in claim 1, wherein the local coil connecting lead comprises multiple flexible printed circuit boards.

7. The standing wave trap as claimed in claim 6, each of the multiple flexible printed circuit boards has a plastic substrate with a plurality of conductors.

8. The standing wave trap as claimed in claim 1, wherein the at least one flexible printed circuit board comprises only one multilayer flexible printed circuit board.

9. The standing wave trap as claimed in claim 8, wherein each layer of the multilayer flexible printed circuit board has a plastic substrate with a plurality of conductors.

10. The standing wave trap as claimed in claim 1, further comprising an at least partially conductive cylinder having a thread, wherein the at least partially conductive cylinder is configured to be screwed into the wound standing wave trap, using the thread, to tune a blocking frequency of the standing wave trap.

11. The standing wave trap as claimed in claim 1, further comprising a plastic cylinder having a metallized surface and configured to be screwed into a spiral shape formed by the wound local coil connecting lead to tune a blocking frequency of the standing wave trap.

12. The standing wave trap as claimed in claim 1, wherein the local coil connecting lead is at least partially enclosed by a shield configured to shield the local coil connecting lead from electromagnetic waves.

13. The standing wave trap as claimed in claim 12, further comprising a capacitor connected to the shield of the local coil connecting lead at two points of the shield such that the standing wave trap is formed on the shield of the local coil connecting lead.

14. The standing wave trap as claimed in claim 1, wherein the local coil connecting lead is completely enclosed by a shield configured to shield the local coil connecting lead from electromagnetic waves.

15. The standing wave trap as claimed in claim 1, wherein the local coil connecting lead is at least partially enclosed by a shield and the shield is enclosed by an insulator.

16. The standing wave trap as claimed in claim 1, wherein one end of the local coil connecting lead extends laterally outward from one side of a spiral shape formed by the wound local coil connecting lead.

17. The standing wave trap as claimed in claim 1, wherein one end of the local coil connecting lead extends laterally outward from both sides of a spiral shape formed by the wound local coil connecting lead.

18. The standing wave trap as claimed in claim 1, wherein the local coil connecting lead is connected to an evaluation device of a magnetic resonance tomography system.

19. The standing wave trap as claimed in claim 1, wherein the local coil connecting lead has a plurality of male, female, or male and female connectors, and wherein one end of the local coil connecting lead is connected to an magnetic resonance tomography local coil using at least one of the plurality of the connectors and another end of the local coil connecting lead is connected to an evaluation device of a magnetic resonance tomography system using at least one of the plurality of the connectors.

20. The standing wave trap as claimed in claim 1, further comprising a capacitor disposed on a rigid central subsection of the local coil connecting lead to produce electrical resonance.

21. The standing wave trap as claimed in claim 1, further comprising a capacitor connected to a section of a spiral shape formed by the wound local coil connecting lead, and wherein the capacitor is connected to the wound local coil connecting lead using a copper strip.

22. The standing wave trap as claimed in claim 1, further comprising a capacitor connected to a section of a spiral shape formed by the wound local coil connecting lead, and wherein the capacitor is connected to the wound local coil connecting lead via a lateral branch of the local coil connecting lead.

23. The standing wave trap as claimed in claim 1, wherein a spiral shape formed by the wound local coil connecting lead comprises an inductor and a parallel capacitor.

24. The standing wave trap as claimed in claim 1, wherein the local coil connecting lead is only wound through part of its length.

* * * * *